United States Patent
Tian et al.

(10) Patent No.: US 11,881,858 B2
(45) Date of Patent: Jan. 23, 2024

(54) CLOCK GENERATION CIRCUIT, MEMORY AND METHOD FOR CALIBRATING CLOCK DUTY CYCLE

(71) Applicant: CHANGXIN MEMORY TECHNOLOGIES, INC., Hefei (CN)

(72) Inventors: Kai Tian, Hefei (CN); Yuxia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 231 days.

(21) Appl. No.: 17/502,111

(22) Filed: Oct. 15, 2021

(65) Prior Publication Data

US 2022/0131532 A1 Apr. 28, 2022

Related U.S. Application Data

(63) Continuation of application No. PCT/CN2021/105207, filed on Jul. 8, 2021.

(30) Foreign Application Priority Data

Oct. 28, 2020 (CN) .......................... 202011176592.4

(51) Int. Cl.
*H03K 3/017* (2006.01)
*G11C 11/4076* (2006.01)
(Continued)

(52) U.S. Cl.
CPC ............. *H03K 3/017* (2013.01); *G11C 7/222* (2013.01); *G11C 11/4076* (2013.01); *H03L 7/08* (2013.01)

(58) Field of Classification Search
CPC ...... H03K 3/017; H03K 5/135; H03K 5/1565; G11C 7/222; G11C 11/4076;
(Continued)

(56) References Cited

U.S. PATENT DOCUMENTS 5,495,205 A * 2/1996 Parker .................. H03L 7/0995
331/25
7,015,739 B2 3/2006 Lee
(Continued)

FOREIGN PATENT DOCUMENTS

| CN | 1542861 A | 11/2004 |
| CN | 1675836 A | 9/2005 |

(Continued)

OTHER PUBLICATIONS

Supplementary European Search Report in the European application No. 21856922.6, dated Nov. 2, 2022, 11 pgs.
(Continued)

*Primary Examiner* — Donald H B Braswell
(74) *Attorney, Agent, or Firm* — Cooper Legal Group, LLC

(57) ABSTRACT

A clock generation circuit, a memory and a clock duty cycle calibration method are provided; the clock generation circuit comprises: an oscillation circuit, configured to generate a first oscillation signal and a second oscillation signal, a frequency of the first oscillation signal is same as a frequency of the second oscillation signal, and a phase of the first oscillation signal is opposite to a frequency of the second oscillation signal; a comparison unit, configured to receive the first oscillation signal and the second oscillation signal, and compare the duty cycle of the first oscillation signal and/or the duty cycle of the second oscillation signal; and a logical unit, connected to the comparison unit and the oscillation circuit, and configured to control the oscillation circuit according to an output result of the comparison unit, so that the duty cycle reaches a preset range.

17 Claims, 5 Drawing Sheets

(51) Int. Cl.
*G11C 7/22* (2006.01)
*H03L 7/08* (2006.01)

(58) Field of Classification Search
CPC .............. G11C 29/023; G11C 29/028; G11C 29/12015; G11C 29/56012; G11C 2207/2254; H03L 7/08; H03B 5/04; H03B 5/06; H03B 5/32
See application file for complete search history.

(56) References Cited

U.S. PATENT DOCUMENTS

| | | | |
|---|---|---|---|
| 7,321,269 B2 | 1/2008 | Drake | |
| 7,501,870 B2 | 3/2009 | Choi | |
| 7,872,510 B2 | 1/2011 | Lee | |
| 8,154,352 B2 | 4/2012 | Ueno | |
| 9,030,244 B1 | 5/2015 | Luo | |
| 9,252,753 B2 | 2/2016 | Lin et al. | |
| 9,270,256 B2 | 2/2016 | Lee | |
| 9,667,252 B1 | 5/2017 | Lee et al. | |
| 9,985,619 B2 | 5/2018 | Lee et al. | |
| 9,998,125 B2 | 6/2018 | Balamurugan et al. | |
| 10,241,537 B2 | 3/2019 | Li et al. | |
| 10,249,354 B1 | 4/2019 | Lee et al. | |
| 10,270,429 B1 | 4/2019 | Wang | |
| 10,411,675 B2 | 9/2019 | Kim et al. | |
| 10,418,983 B1 | 9/2019 | Lee | |
| 10,458,857 B2 | 10/2019 | Rachala et al. | |
| 10,601,410 B1 | 3/2020 | Satoh | |
| 10,630,273 B2 | 4/2020 | Tung et al. | |
| 10,700,672 B2 | 6/2020 | Savary et al. | |
| 10,784,846 B1 | 9/2020 | Bucossi | |
| 10,826,476 B1 | 11/2020 | Bucossi | |
| 10,862,460 B2 | 12/2020 | Kim et al. | |
| 2004/0032300 A1 | 2/2004 | Joordens | |
| 2004/0189364 A1 | 9/2004 | Lee | |
| 2006/0152266 A1* | 7/2006 | Han | G11C 29/50012 327/175 |
| 2007/0018737 A1 | 1/2007 | Drake | |
| 2007/0090867 A1 | 4/2007 | Kim | |
| 2007/0176659 A1* | 8/2007 | Gomm | H03K 5/1565 327/175 |
| 2007/0241826 A1 | 10/2007 | Ueno | |
| 2008/0024182 A1 | 1/2008 | Choi | |
| 2008/0024233 A1 | 1/2008 | Drake | |
| 2008/0204094 A1 | 8/2008 | Hur | |
| 2009/0002042 A1* | 1/2009 | Rausch | G11C 29/02 327/175 |
| 2009/0051443 A1 | 2/2009 | Illegems | |
| 2009/0115459 A1 | 5/2009 | Kwon | |
| 2009/0302912 A1 | 12/2009 | Lee | |
| 2012/0075025 A1 | 3/2012 | Ueno | |
| 2015/0171836 A1 | 6/2015 | Lee | |
| 2015/0372665 A1 | 12/2015 | Tohidian et al. | |
| 2016/0006420 A1 | 1/2016 | Lin et al. | |
| 2016/0241249 A1 | 8/2016 | Balamurugan et al. | |
| 2017/0117887 A1* | 4/2017 | Lee | H03K 5/1565 |
| 2017/0179956 A1 | 6/2017 | Lee et al. | |
| 2017/0194947 A1 | 7/2017 | Wei | |
| 2018/0358954 A1 | 12/2018 | Kim et al. | |
| 2018/0364752 A1 | 12/2018 | Li et al. | |
| 2019/0149141 A1* | 5/2019 | Hsieh | H03B 5/1228 327/116 |
| 2019/0190501 A1 | 6/2019 | Wang et al. | |
| 2019/0215146 A1 | 7/2019 | Ke et al. | |
| 2019/0237127 A1 | 8/2019 | Moon et al. | |
| 2019/0257696 A1 | 8/2019 | Rachala et al. | |
| 2019/0280682 A1 | 9/2019 | Lee | |
| 2019/0334508 A1 | 10/2019 | Tang | |
| 2019/0348971 A1 | 11/2019 | Kim et al. | |
| 2020/0052681 A1 | 2/2020 | Tung et al. | |
| 2020/0136599 A1 | 4/2020 | Savary et al. | |
| 2020/0160902 A1 | 5/2020 | Gans | |
| 2020/0162066 A1 | 5/2020 | Gans | |
| 2020/0336135 A1 | 10/2020 | Wang et al. | |
| 2021/0036690 A1 | 2/2021 | Tang | |
| 2021/0218388 A1 | 7/2021 | Wang et al. | |

FOREIGN PATENT DOCUMENTS

| | | |
|---|---|---|
| CN | 1956329 A | 5/2007 |
| CN | 101141129 A | 3/2008 |
| CN | 101409541 A | 4/2009 |
| CN | 101629978 A | 1/2010 |
| CN | 103684365 A | 3/2014 |
| CN | 104270122 A | 1/2015 |
| CN | 104716929 A | 6/2015 |
| CN | 104734697 A | 6/2015 |
| CN | 105099445 A | 11/2015 |
| CN | 105281757 A | 1/2016 |
| CN | 205385473 U | 7/2016 |
| CN | 106374890 A | 2/2017 |
| CN | 106888007 A | 6/2017 |
| CN | 106941344 A | 7/2017 |
| CN | 105281757 B | 7/2018 |
| CN | 108768385 A | 11/2018 |
| CN | 110266294 A | 9/2019 |
| CN | 110830011 A | 2/2020 |
| CN | 111103530 A | 5/2020 |
| CN | 111147055 A | 5/2020 |
| JP | 2006333184 A | 12/2006 |
| KR | 20080009855 A | 1/2008 |
| KR | 100998677 B1 | 12/2010 |

OTHER PUBLICATIONS

International Search Report in the international application No. PCT/CN2021/105207, dated Sep. 28, 2021, 6 pgs.
International Search Report in the international application No. PCT/CN2021/112329, dated Oct. 29, 2021, 7 pgs.
International Search Report in the international application No. PCT/CN2021/105250, dated Oct. 13, 2021, 5 pgs.
International Search Report in the international application No. PCT/CN2021/106019, dated Oct. 20, 2021, 7 pgs.
International Search Report in the international application No. PCT/CN2021/107942, dated Oct. 20, 2021, 5 pgs.
International Search Report in the international application No. PCT/CN2021/118858, dated Dec. 2, 2021, 8 pgs.
Supplementary European Search Report in the European application No. 21870482.3, dated Nov. 23, 2022, 12 pgs.
"Ring Oscillator Layout Design", Sep. 2019, Reprinted from the Internet at: https://maxbook118.com/html/2019/0901/6153212200002101,shtm, 10 pgs.
"Design of Low Noise Single Ended CMOS Ring Voltage Controlled Oscillators", 2004, Tai Zhang, Xue-Cheng Zou, Li Liu, Chun-Bo Ni, Zhao-Yang Chen and Xu-Bang Shen, Microelectronics and Computing, vol. 7, No. 21, ISSN: 1000-7180, pp. 164-167.
"Schematic and Layout Simulation Exercise", 2009, ELAD ALON, University of California, Berkeley, Laboratory Exercise 4, Reprinted from the Internet at: http://bwrcs.eecs.berkeley.edu/Classes/icdesign/eel41_f12/CurrentLabs/Lab%204.pdf, 5 pgs.
"Integrated Circuit Design and Implementation Technology Based on ZENI", Oct. 2013, Zhou Shengming, Xidian University Press, 2 pgs.
"A 20-GB/s 256-Mb DRAM with an Inductorless Quadrature PLL and a Cascaded Pre-emphasis Transmitter", Jan. 2006, Kyu-Houn Kim, Young-Soo Soh, Chan-Kyoung Kim, Dong-Jin Lee, Gyung-Su Byun, Hoon-Lee, Jae-Hyoung Le, Jung Sunwoo, Jung-Hwan Choi, Jun-Wan Chai, Changhyun Kim, Soo-In Choo, in IEEE Journal of Solid-State Circuits, vol. 41, No. 1, 2 pgs.
"Four-State Ring Oscillator for Quadrature Signal Generation", Sep. 2008, Tadashi Kusaga and Takeshi Shima, ICSES 2008 International Conference on Signals and Electronic Systems, Krakow, pp. 89-92.
Supplementary European Search Report in the European application No. 21870566.3, dated Dec. 9, 2022, 6 pgs.

\* cited by examiner

CLOCK GENERATION CIRCUIT, MEMORY AND METHOD FOR CALIBRATING CLOCK DUTY CYCLE

CROSS-REFERENCE TO RELATED APPLICATIONS

The application is a continuation of International Application No. PCT/CN2021/105207, filed on Jul. 8, 2021, which is based upon and claims priority to Chinese patent application No. 202011176592.4, filed on Oct. 28, 2020 in China Patent Office and entitled "Clock Generation Circuit, Memory and Method for Calibrating Clock Duty Cycle". The contents of International Application No. PCT/CN2021/105207 and Chinese patent application No. 202011176592.4 are hereby incorporated by reference in their entireties.

BACKGROUND

A semiconductor memory is used in many electronic systems to store retrievable data. As the demand for the electronic system that faster, having greater data capacity and consuming less power consumption is growing, the semiconductor memory may need to be faster, store more data and use less power in order to meet changing needs.

Usually, the semiconductor memory is controlled by providing commands, memory addresses and clocks to the memory, and various commands, memory addresses and clocks may be provided by a memory controller. These three types of signals may control the memory to execute various storage operations, such as a read operation for reading data from the memory, and a write operation for storing data in the memory. Based on a known sequence related to a "related command" received by the memory, data is transmitted between the memory and the memory controller. Specifically, a system clock configured to time the commands and the addresses may be provided for the memory. Further, a data clock may also be provided to the memory, and the data clock is used as a time sequence of reading data and a time sequence of writing data. Moreover, the memory may also provide a clock to the controller, as a time sequence for transmitting data to the controller. An external clock provided for the memory is configured to generate an internal clock, and the internal clock controls time sequences of various internal circuits during a storage operation of the memory. The time sequences of the internal circuits during operation of the memory are critical. Furthermore, deviation of the internal clock may cause wrong operation. The deviation of the clock may include duty cycle distortion, that is, the duty cycle of a clock signal deviates from a preset duty cycle.

Therefore, the memory is required to have a Duty Cycle Adjust (DCA) function and a Duty Cycle Monitor (DCM) function, that is, the memory may include a DCA circuit and a DCM circuit. The DCA circuit may be configured to adjust the duty cycle of the internal clock generated by the external clock, and the DCM circuit may be configured to monitor whether the duty cycle of the clock deviates from the preset duty cycle or not.

Moreover, the memory needs to be tested before the memory is delivered. However, the performance of test equipment has a great impact on test results and affects the accuracy of the test results. It is found through analysis that, the test equipment is used to provide an input signal for the memory at present, and the input signal is a working signal required by the memory to complete the read-write operation. However, the current mainstream test equipment may generally only work at a relatively low frequency (such as about 200 MHz), which is far from the maximum working frequency of a high-speed memory. The high-speed memory includes a Dynamic Random Access Memory (DRAM), such as Low Power Double Data Rate (LPDDR) 4, LPDDR5 or LPDDR6. Therefore, it is difficult to make good judgment and selection on the characteristics of a high-speed input port of the DRAM by using the test equipment, and the high-speed input port includes a data port/system clock port/data clock port (DQ/CK/WCK). Moreover, some high-speed test equipment may only set the frequency of the input signal, which is difficult to ensure that the duty cycle is accurately stable in the preset duty cycle, resulting in test deviation and affecting the accuracy of test results.

SUMMARY

The embodiments of the disclosure relate, but are not limited, to a clock generation circuit, a memory and a method for calibrating a clock duty cycle.

The embodiments of the disclosure provide a clock generation circuit. The clock generation circuit includes: an oscillation circuit, configured to generate a first oscillation signal and a second oscillation signal, a frequency of the first oscillation signal is same as a frequency of the second oscillation signal, and a phase of the first oscillation signal is opposite to a phase of the second oscillation signal; a comparison unit, configured to receive the first oscillation signal and the second oscillation signal, and compare at least one of: the duty cycle of the first oscillation signal or the duty cycle of the second oscillation signal; and a logical unit, connected to the comparison unit and the oscillation circuit, and configured to control the oscillation circuit according to an output result of the comparison unit, so that the duty cycles reach a preset range.

The embodiments of the application further provide a memory, which may include the abovementioned clock generation circuit.

The embodiments of the application further provide a method for calibrating a clock duty cycle. The method includes that: an oscillation circuit generates a first oscillation signal and a second oscillation signal, a frequency of the first oscillation signal is same as a frequency of the second oscillation signal, and a phase of the first oscillation signal is opposite to a phase of the second oscillation signal, and the first oscillation signal having an initial duty cycle; a comparison unit receives the first oscillation signal and the second oscillation signal, and compares the duty cycle of the first oscillation signal or the duty cycle of the second oscillation signal; and a logical unit controls the oscillation circuit according to an output result of the comparison unit, so that the duty cycle of the first oscillation signal generated by the oscillation circuit changes from the initial duty cycle to the preset duty cycle.

BRIEF DESCRIPTION OF THE DRAWINGS

One or more embodiments are exemplified by the pictures in the corresponding accompanying drawings, and the exemplary descriptions do not constitute a limitation to the embodiments. Elements in the drawings having the same reference numerals denote similar elements, and unless otherwise stated, the figures in the drawings do not constitute a proportional limitation.

DETAILED DESCRIPTION

In order to enable purposes, technical solutions and advantages of the embodiments of the disclosure to be more clearly, the various embodiments of the disclosure are described in detail in combination with the drawings below. However, it should be understood by those ordinary skilled in the art that, in order to enable a reader to understand the disclosure better, many technical details are provided in the various embodiments of the disclosure. However, the technical solutions required to be protected by the disclosure may also be implemented without these technical details and a variety of change and modifications based on the various embodiments below.

Figure 1:
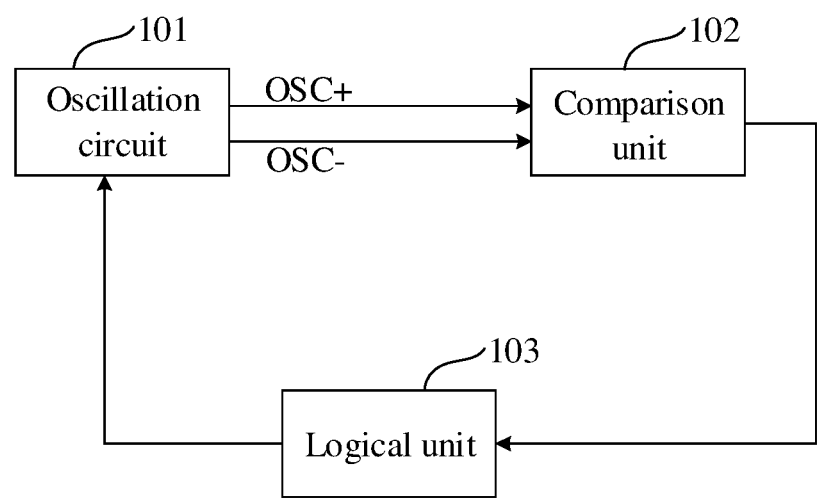
FIG. 1 is a functional block diagram of a clock generation circuit according to an embodiment of the disclosure.
Figure 2:
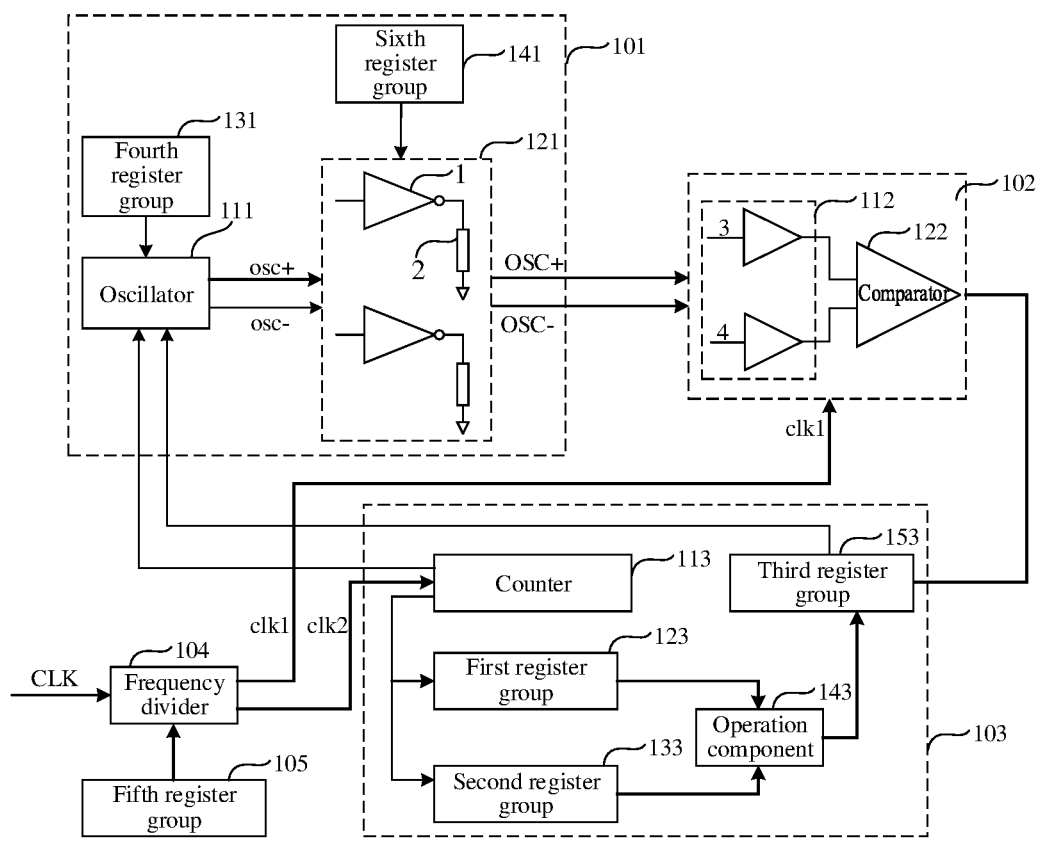
FIG. 2 is a structural schematic diagram of a clock generation circuit according to an embodiment of the disclosure.

FIG. 1 is a functional block diagram of a clock generation circuit according to an embodiment of the disclosure. FIG. 2 is a structural schematic diagram of a clock generation circuit according to an embodiment of the disclosure.

Referring to FIG. 1 and FIG. 2, in the embodiment, the clock generation circuit may include: an oscillation circuit 101, configured to generate a first oscillation signal OSC+ and a second oscillation signal OSC−, the first oscillation signal OSC+ and the second oscillation signal OSC− having the same frequency and opposite phases; a comparison unit 102, configured to receive the first oscillation signal OSC+ and the second oscillation signal OSC−, and compare at least one of: the duty cycle of the first oscillation signal OSC+ or the duty cycle of the second oscillation signal OSC−; and a logical unit 103, connected to the comparison unit 102 and the oscillation circuit 101, and configured to control the oscillation circuit 101 according to an output result of the comparison unit 102, so that the duty cycles reach a preset range.

The clock generation circuit is built in a memory, and may be used as a key component of a Built-In Self Test (BIST) system of the memory. The differential high-speed oscillation signals generated using the oscillation circuit, namely the high-frequency first oscillation signal and the high-frequency second oscillation signal, may test the characteristics of a high-speed input circuit, so as to solve the problem of poor accuracy of a test result caused by too low frequency of an input signal provided by test equipment, and greatly reduce the dependence on Automatic Test Equipment (ATE), thereby reducing the test cost. Moreover, the clock generation circuit may also implement a DCA function and a DCM function of the memory.

The clock generation circuit provided by the embodiment will be described in detail in combination with the drawings.

The first oscillation signal OSC+ and the second oscillation signal OSC− are differential clock signals. Moreover, in the embodiment, the first oscillation signal OSC+ and the second oscillation signal OSC− have high-frequency characteristics. That is, the frequency of the first oscillation signal OSC+ and the frequency of the second oscillation signal OSC− are comparable to the frequency of a clock signal required for the memory to perform read and write operations, and the comparable here may either mean that the frequencies are the same or that the frequency difference is within a test allowable range. For example, the frequency of the first oscillation signal OSC+ and the second oscillation signal OSC− may reach 3.2 GHz or 4.8 GHz, or even 6.4 GHz.

Specifically, the oscillation circuit 101 may include an oscillator 111. The oscillator 111 is configured to generate a first initial oscillation signal osc+ and a second initial oscillation signal osc−. The first initial oscillation signal osc+ and the second initial oscillation signal osc− have the same frequency and opposite phases, that is, the first initial oscillation signal osc+ and the second initial oscillation signal osc− are differential signals.

Figure 3:
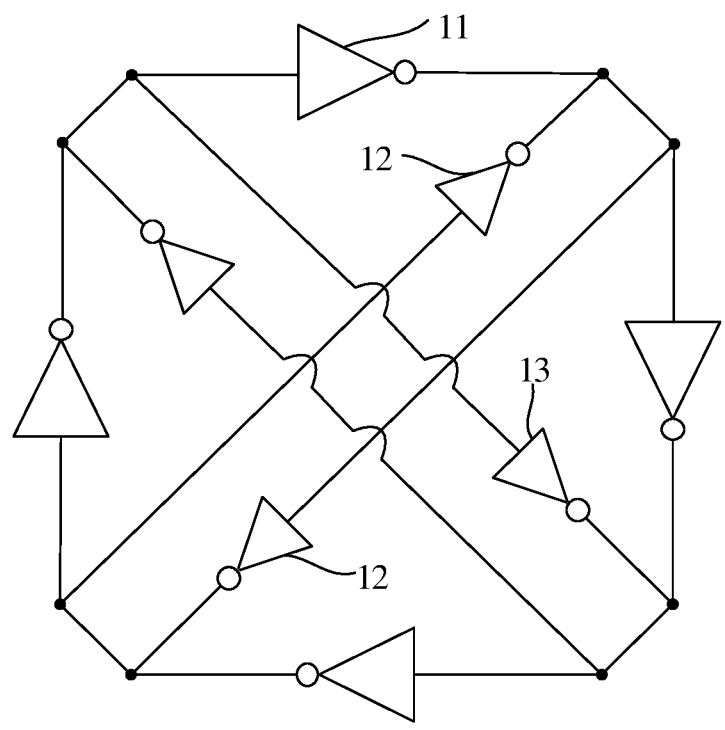
FIG. 3 is a schematic diagram of a circuit structure of an oscillator in an oscillation circuit in FIG. 1.

FIG. 3 is a schematic diagram of a circuit structure of an oscillator 111 according to the embodiment. More specifically, as illustrated in FIG. 3, the oscillator 111 includes a first ring topological structure and a second ring topological structure which are electrically connected with each other. The first ring topological structure includes multiple first phase inverters 11 connected end to end to transmit the oscillation signal at a first transmission speed, and the second ring topological structure includes multiple second phase inverters 12 connected end to end to transmit the oscillation signal at a second transmission speed. The second transmission speed is less than the first transmission speed.

The number of the first phase inverters 11 is an integer greater than or equal to 4, and the number of the second phase inverters 12 is an integer greater than or equal to 2. Moreover, the second transmission speed may be greater than or equal to 0.5 times the first transmission speed.

The oscillator 111 may further include a third ring topological structure, which includes multiple third phase inverters 13 connected end to end to transmit the oscillation signal at a third transmission speed. The first ring topological structure is electrically connected with the third ring topological structure, and the third transmission speed is less than the first transmission speed. Specifically, the number of the third phase inverters 13 is an integer greater than or equal to 2, and the third transmission speed may be the same as the second transmission speed.

Compared with transmission of the oscillation signal only through the first ring topological structure, since the second transmission speed of the second ring topological structure is less than the first transmission speed of the first ring topological structure, the arrangement of the second ring topological structure allows the oscillation signal to be flipped more times per unit time. Thus, a high-speed first initial oscillation signal osc+ and a high-speed second initial oscillation signal osc− are obtained, and then a high-speed first oscillation signal OSC+ and a high-speed second oscillation signal OSC− can be obtained.

In the embodiment, the oscillation circuit 101 may further include a path simulation circuit 121. The path simulation circuit 121 is located between the oscillator 111 and the comparison unit 102. One end of the path simulation circuit is connected to an output end of the oscillator 111, and another end of the path simulation circuit is connected to an input end of the comparison unit 102. The path simulation circuit 121 is configured to simulate the circuit characteristics of a first path, generate the first oscillation signal OSC+ by receiving the first initial oscillation signal osc+, and generate the second oscillation signal OSC− by receiving the second initial oscillation signal osc−.

Circuit characteristics include one or any combination of: device resistance, device capacitance, parasitic resistance, parasitic capacitance, input and output impedance, driving capability or noise environment of the first path. Specifically, the first path refers to a signal path where a clock signal is transmitted to an output end of a high-speed differential input circuit of the memory through a controller. For ease of understanding and explanation, the first path will be described below in combination with FIG. 3.

Figure 4:
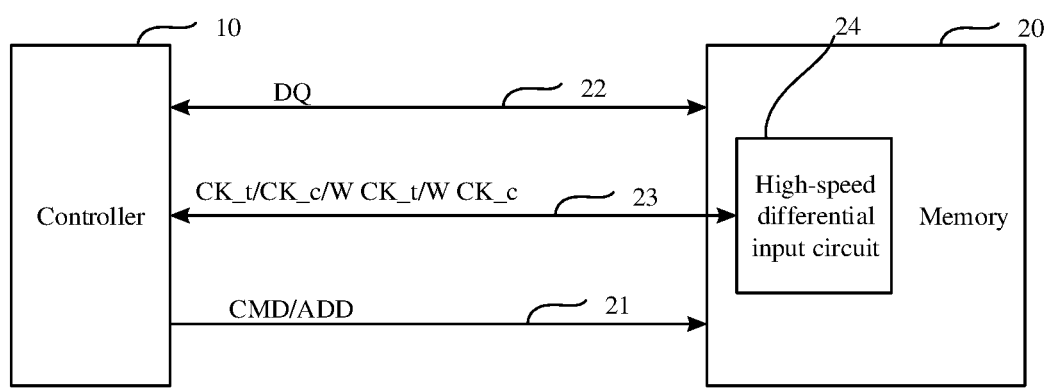
FIG. 4 is a schematic diagram of a memory system.

FIG. 4 is a schematic diagram of a memory system. Referring to FIG. 4, the memory system includes a controller 10 and multiple memories 20, and each memory 20 and the controller 10 are coupled to a command/address bus 21, a data bus 22 and a clock bus 23. For example, the memory 20 may be LPDDR4 or LPDDR5 or LPDDR6, the memory 20 receives a command/address signal provided by the controller 10 through the command/address bus 21 and the command/address signal is marked with CMD/ADD. The data signal is transmitted between the controller 10 and the memory 20 through a data bus 22, and the data signal is marked with DQ. A variety of clock signals are transmitted between the controller 10 and the memory 20 through the clock bus 23, the clock signal may include a system clock signal and a read-write data clock signal, a differential system clock signal is marked with CK_t and CK_c, and a differential read-write data clock signal is marked with WCK_t and WCK_c.

Specifically, the controller 10 is coupled with the high-speed differential input circuit of the memory 20, the high-speed differential input circuit is configured to receive an external clock signal and generate an internal clock signal, and the internal clock signal may be used as a differential input signal to complete the read-write operation of data. More specifically, the high-speed differential input circuit receives CK_t, CK_c, WCK_T and WCK_c to generate an internal clock signal. The high-speed differential input circuit may include an Input Buffer (IB).

The command/address bus 21, the data bus 22 and the clock bus 23 all have resistance and may also generate parasitic resistance or parasitic capacitance. Furthermore, the high-speed differential input circuit 24 itself also has circuit characteristics such as resistance or capacitance. The path simulation circuit 121 is disposed in the oscillation circuit 101 to simulate these circuit characteristics. In the embodiment, by disposing the path simulation circuit 121 in the oscillation circuit, the path simulation circuit 121 may not only amplify and output the first initial oscillation signal osc+ and the second initial oscillation signal osc−, but also simulate the circuit characteristics from the controller 10 to an output end of the high-speed differential input circuit 24, so that the first oscillation signal OSC+ and the second oscillation signal OSC− are high-speed clock signals that are more in line with the real application scenario of the memory, and thus a test result is more accurate and effective.

As illustrated in FIG. 2, the path simulation circuit 121 may include a simulation buffer 1 and an On Die Termination (ODT) 2.

Generally, when high-speed test equipment is used to provide an input signal, in order to ensure the stability of the input signal, the level of the input signal is usually a fixed value and may not be changed at will, which is different from the actual application of the memory. Therefore, test deviation will be introduced, and the accuracy of the test result will be affected. However, in the embodiment, the first oscillation signal OSC+ and the second oscillation signal OSC− are used as input signals, and the level of the first oscillation signal OSC+ and the level of the second oscillation signal OSC− may be adjusted through the path simulation circuit 121, so that the test result is more accurate.

It should to be understood that, in other embodiments, the oscillation circuit may also include only an oscillator. That is, the oscillator directly generates the first oscillation signal OSC+ and the second oscillation signal OSC−.

In the embodiment, the oscillation circuit 101 may further include a fourth register group 131. The fourth register group 131 is connected to the oscillator 111, and is configured to configure the frequency of the first oscillation signal OSC+ and the frequency of the second oscillation signal OSC−. Specifically, the fourth register group 131 configures the frequency of the first oscillation signal OSC+ by configuring the frequency of the first initial oscillation signal osc+, and configures the frequency of the second oscillation signal OSC− by configuring the frequency of the second initial oscillation signal osc−.

Herein, the fourth register group 131 may be a Model Register (MR). The MR may also be integrated into an MR required by the memory to implement the read-write operation function. The MR may also be a function module independent of the MR of the memory.

The oscillation circuit 101 may further include a sixth register group 141. The sixth register group 141 is connected to the path simulation circuit 121, and is configured to configure electrical parameters of the path simulation circuit 121. Specifically, the electrical parameters of the path simulation circuit 121 are adjusted by the sixth register group 141, so as to adjust the circuit characteristics of the first path simulated by the path simulation circuit 121.

Herein, the sixth register group 141 may be an MR. The MR may also be integrated into the MR required by the memory to implement the read-write operation function. The MR may also be a function module independent of the MR of the memory.

For example, the output state of the path simulation circuit 121 is set and selected through the sixth register group 141. Taking LPDDR4 as an example, VOH=(1/3)*VDDQ or VOH=(1/2.5)*VDDQ, PDDS=40 ohm, ODT=40 ohm is set, where VOH is output driving voltage, PDDS is input pull-down drive strength, and ODT is on-chip termination resistance.

Since the first oscillation signal OSC+ and the second oscillation signal OSC− are differential signals, the sum of the duty cycle of the first oscillation signal OSC+ and the duty cycle of the second oscillation signal OSC− is 100%. The duty cycles of the differential first oscillation signal OSC+ and second oscillation signal OSC− is detected by disposing the comparison unit 102. Specifically, the comparison unit 102 compares at least one of: the duty cycle of the first oscillation signal OSC+ or the duty cycle of the second oscillation signal OSC− may include at least one of the following three cases.

The comparison unit 102 compares the duty cycle of the first oscillation signal OSC+. Specifically, the comparison unit 102 compares whether the duty cycle of the first oscillation signal OSC+ reaches the preset range or not, for example, the preset range may be from 48% to 52%. If the comparison unit 102 determines that the duty cycle of the first oscillation signal OSC+ is within the preset range, it indicates that the duty cycle of the second oscillation signal OSC− is also within the preset range. If the comparison unit 102 determines that the duty cycle of the first oscillation signal OSC+ is not within the preset range, it indicates that the duty cycle of the second oscillation signal OSC− is also not within the preset range.

The comparison unit 102 compares the duty cycle of the second oscillation signal OSC−. Specifically, the comparison unit 102 compares whether the duty cycle of the second oscillation signal OSC− reaches the preset range or not, for example, the preset range may be from 48% to 52%. If the comparison unit 102 determines that the duty cycle of the second oscillation signal OSC− is within the preset range, it indicates that the duty cycle of the first oscillation signal OSC+ is also within the preset range. If the comparison unit 102 determines that the duty cycle of the second oscillation signal OSC− is not within the preset range, it indicates that the duty cycle of the first oscillation signal OSC+ is also not within the preset range.

The comparison unit 102 compares the duty cycle of the first oscillation signal OSC+ and the duty cycle of the first oscillation signal OSC+. Specifically, the comparison unit 102 compares whether a difference value between the duty cycle of the first oscillation signal OSC+ and the duty cycle of the second oscillation signal OSC− is within the preset difference value range, which may be from −4% to 4%. If the comparison unit 102 determines that the difference value is within the preset difference value range, it indicates that the duty cycle of the first oscillation signal OSC+ and the duty cycle of the second oscillation signal OSC− are within the preset range. Otherwise, the duty cycle of the first oscillation signal OSC+ and the duty cycle of the second oscillation signal OSC− do not reach the preset range.

It should be understood that, both the numerical ranges of the abovementioned preset range and preset difference value range are exemplary descriptions. The embodiments do not limit the preset range and the preset difference value range, and the preset range and the preset difference value range may be reasonably set according to actual performance requirements of the memory.

In the embodiment, the comparison unit 102 may include: an integral unit 112, having a first input end 3 for receiving one of the first oscillation signal OSC+ or the second oscillation signal OSC−, and a second input end 4 for receiving another one of the first oscillation signal OSC+ or the second oscillation signal OSC−; and a comparator 122, connected to an output end of the integral unit 112.

Specifically, the integral unit 112 may include two integral circuits, the first input end 3 is used as an input end of one integral circuit, and the second input end 4 is used as an input end of another integral circuit. The comparator 122 is configured to compare outputs of the two integral circuits and output a high level or a low level.

More specifically, the comparison unit 102 performs integral operation on the input first oscillation signal OSC+ and second oscillation signal OSC− through the two integral circuits, the result of the integral operation is input into the comparator 122, and the comparator 122 outputs a comparison result.

Taking the first oscillation signal OSC+ as a positive end (duty+) and the second oscillation signal OSC− as a negative end (duty−), in an example, if the output of the comparator 122 is at a high level, it indicates that the duty cycle of the first oscillation signal OSC+ is greater than the duty cycle of the second oscillation signal OSC−. If the output of the comparator 122 is at a low level, it indicates that the duty cycle of the first oscillation signal OSC+ is less than the duty cycle of the second oscillation signal OSC−.

It should be understood that, the abovementioned corresponding relationship between the output result of the comparison unit 102 and the duty cycle of the first oscillation signal OSC+ and the duty cycle of the second oscillation signal OSC− is merely exemplary. The embodiment does not limit the corresponding relationship between the high level and the low level, and the duty cycle of the first oscillation signal OSC+ and the duty cycle of the second oscillation signal OSC−, as long as it is ensured that different output results correspond to the different corresponding relationships between the duty ratio of the first oscillation signal OSC+ and the duty ratio of the second oscillation signal OSC−.

As illustrated in FIG. 2, the output result of the comparison unit 102 may be sampled and output through a sampling clock clk1. In the embodiment, the comparison unit 102 is driven by the sampling clock clk1, and the frequency of the sampling clock clk1 is lower than the frequency of the first oscillation signal OSC+ and/or the frequency of the second oscillation signal OSC−. The faster the frequency of the sampling clock clk1 is, the greater the sampling error is. The slower the frequency of the sampling clock clk1 is, the smaller the sampling error is, but the longer the test time is. Therefore, the optimal frequency of the sampling clock clk1 may be comprehensively selected according to the sampling error and the test time.

In the embodiment, a clock generation circuit further includes a frequency divider 104. The frequency divider 104 is configured to receive an external clock signal CLK, and generate the sampling clock clk1. The external clock signal CLK may be provided by the test equipment or a main clock signal of the memory.

Moreover, it can be seen from the foregoing analysis that, if the frequency of the sampling clock clk1 is adjustable, different frequencies of the sampling clock clk1 may be selected according to actual conditions. Therefore, in the embodiment, the clock generation circuit may further include a fifth register group 105. The fifth register group 105 is connected with the frequency divider 104, and configured to configure the frequency of the sampling clock. The fifth register group 105 may be an MR. A detailed description of the fifth register group 105 may refer to the foregoing description of the fourth register group 131 and the sixth register group 141.

As inherent characteristics of the comparison unit 102 may cause input deviation, in order to eliminate the error of the test result caused by the input deviation of the comparison unit 102, in the embodiment, the comparison unit 102 may further be configured such that the first input end and the second input end are interchangeable. Specifically, the comparison unit 102 is configured as below.

The first input end of the integral unit 112 receives the first oscillation signal OSC+ when a turnover identification signal is at a low level, and receives the second oscillation signal OSC− when the turnover identification signal is at a high level. The second input end of the integral unit 112 receives the second oscillation signal OSC− when the turnover identification signal is at a low level, and receives the first oscillation signal OSC+ when the turnover identification signal is at a high level. Herein, there is an MR in the memory, the turnover identification signal may be provided by the MR. For example, the turnover identification signal may be DCM MR OP[1] in LPDDR4 or LPDDR5 or LPDDR6. DCM MR OP[1]=0 indicates that the turnover identification signal is at a low level, and if the DCM MR OP[1] is 1, it indicates that the turnover identification signal is at a high level.

The logical unit 103 may include: a counter 113, configured to adjust the duty cycle of the first oscillation signal OSC+ and/or the duty cycle of the second oscillation signal OSC−; a first register group 123, configured to store the first value of the counter 113 according to the output of the comparator 122 when the turnover identification signal is at a low level; and a second register group 133, configured to store the second value of the counter 113 according to the output of the comparator 122 when the turnover identification signal is at a high level.

Specifically, the counter 113 has the functions of adjusting the duty cycle of the first oscillation signal OSC+ and the duty cycle of the second oscillation signal OSC− output by the oscillation circuit 101, and the change of the duty cycle of the first oscillation signal OSC+ and the duty cycle of the second oscillation signal OSC− is monotonic. For example, the duty cycle changes from minimum to maximum or from maximum to minimum in one counting cycle. In one counting cycle, the output result of the comparator 122 will have only one inversion point, the value of the counter 113 corresponding to the inversion point is the setting that the duty cycle of the first oscillation signal OSC+ and the duty cycle of the second oscillation signal OSC− output by the oscillation circuit 101 are closest to the preset range, and that value is used as the value of the counter and stored in the first register group 123 or the second register group 133.

More specifically, when the turnover identification signal is at a low level, the first value of the counter 113 is stored according to output of the comparator 122, and the first value is stored in the first register group 123. When the turnover identification signal is at a high level, the second value of the counter 113 is stored according to output of the comparator 122, and the second value is stored in the second register group 133. For ease of understanding, the working principle of the logical unit 103 will be described in detail below.

When the turnover identification signal is at a low level, the first input end of the integral unit 112 receives the first oscillation signal OSC+, and the second input end receives the second oscillation signal OSC−. The counter 113 starts counting, for example, the counter 113 counts from 0 to 31 in one counting cycle, and meanwhile, the duty cycles of the first oscillation signal OSC+ and second oscillation signal OSC− output by the oscillation circuit 101 also change from minimum to maximum (such as from 40% to 60%) or from maximum to minimum. Therefore, in one counting cycle (such as from 0 to 31), the comparator 122 will have only one inversion point, the value of the counter 113 corresponding to the inversion point is the first value, the first value corresponds to the setting that the duty cycle of the oscillation signal output by the oscillator 111 through the path simulation circuit 121 is closest to the preset range, for example, the first value may correspond that the duty cycle is closest to 50%, and the first value is stored in the first register group 123.

When the turnover identification signal is at a high level, the first input end of the integral unit 112 receives the second oscillation signal OSC−, the second input end receives the first oscillation signal OSC+. That is, input ends of the comparison unit 102 are interchanged. The counter 113 enters a new counting cycle, for example, the counter 113 counts from 0 to 31, and similarly, the second value of the counter 113 corresponding to the output inversion point of the comparator 122 is stored in the second register group 133.

It should be understood that, the abovementioned counting cycle from 0 to 31 is merely exemplary description. The counting type of the counter 113 is not limited in the embodiment. The counter 113 may be either an addition counter or a subtraction counter, which may be either a sequential incremental or decremental count, or a step-by-step incremental or decremental count, as long as it is ensured that the counter 113 varies monotonically within a single counting cycle.

The first input end and the second input end of the comparison unit 102 are interchanged, in a manner of controlling the oscillation circuit 101 through counting twice, the adverse effect caused by the input deviation of the comparison unit 102 itself may be eliminated, and the accuracy of the test result can be further improved.

Moreover, the logical unit 103 may further include: an operation component 143, connected to the first register group 123 and the second register group 133, and configured to perform at least one operation of addition, subtraction, multiplication or division on outputs of the first register group 123 and the second register group 133; and a third register group 153, connected to the operation component 143, and configured to store an output result of the operation component 143.

Specifically, the output of the first register group 123 refers to the first value stored in the first register group 123, and the output of the second register group 133 refers to the second value stored in the second register group 133. In the embodiment, the operation component 143 adds the first value and the second value and divides the sum by 2 to obtain an average value, the average value is used as an output result of the operation component 143, and the average value is stored in the third register group 153. Because the average value already eliminates the input deviation of the comparison unit 102 itself, the average value corresponds the setting that the duty cycle of the first oscillation signal OSC+ and the duty cycle of the second oscillation signal OSC− output by the oscillation circuit 101 are closest to the preset range. For example, the duty cycle of the first oscillation signal OSC+ and the duty cycle of the second oscillation signal OSC− are closest to 50%.

It should be understood that, the average value may be an integer where the first value and the second value are summed and divided by 2 to round up, or an integer where the first value and the second value are summed and divided by 2 to round down.

It should be understood that, in the embodiment, averaging of the first value and the second value is taken as an example, and in other embodiments, other operation modes may also be used to operate on the first value and the second value.

The first register group 123, the second register group 133 and the third register group 153 may be MRs.

In the embodiment, the counter 113 is driven by a calculator clock, and the frequency of the calculator clock is lower than the frequency of the first oscillation signal OSC+ and/or the frequency of the second oscillation signal OSC−. The frequency of the calculator clock is adjustable, and the frequency of the calculator clock is reasonably selected according to the speed of adjusting the oscillation circuit 101.

Moreover, the frequency of the sampling clock may be the same as the frequency of the calculator clock. The frequency divider may further be configured to receive an external clock signal, and generate the sampling clock and the calculator clock. Similarly, the fifth register group may further be configured to configure the frequency of the calculator clock.

The value stored in the third register group 153 corresponds to the setting of the oscillation circuit 101. At this case, the duty cycle selection of the oscillation circuit 101 is switched from the counter 113 to the third register group 153, so that the oscillation circuit 101 fixedly outputs the first oscillation signal OSC+ and the second oscillation signal OSC− with the optimal duty cycles. It should be understood that, during a period that the oscillation circuit 101 fixedly outputs the first oscillation signal OSC+ and the second oscillation signal OSC− with the optimal duty cycles, the comparison unit 102 may continuously compare the duty cycle of the first oscillation signal OSC+ and/or the duty cycle of the second oscillation signal OSC−. When the duty cycle of the first oscillation signal OSC+ and the duty cycle of the second oscillation signal OSC− depart from the preset range, the problem may be detected in time.

According to the clock generation circuit provided by the embodiment, the first oscillation signal and the second oscillation signal with high-speed and adjustable duty cycles may be generated in the memory through the oscillation circuit 101, the comparison unit 102 and the logical unit 103. The first oscillation signal and the second oscillation signal are differential signals. The first oscillation signal and the second oscillation signal meet the requirements of a high-frequency working signal of the memory. Therefore, the first oscillation signal and the second oscillation signal may be used as test input signals for testing the memory, so that the memory may implement a BIST function, and there is no need to use additional test equipment to provide test input signals. Meanwhile, the problem that the test equipment is difficult to provide a high-frequency test input signal is solved.

Moreover, in the embodiment, the comparison unit 102 detects output of the oscillation circuit 101, and the logical unit 103 controls the oscillation circuit 101 based on the output result of the comparison unit 102, so that the duty cycle of the first oscillation signal and the duty cycle of the second oscillation signal may be stabilized within the preset range, thereby avoiding the adverse effect of duty cycle deviation on the test accuracy, and improving the test accuracy of testing the memory by utilizing the first oscillation signal and the second oscillation signal. For example, the duty cycle of the first oscillation signal and the duty cycle of the second oscillation signal may be precisely controlled at 50%.

Moreover, the oscillation circuit 101 may further include a path simulation circuit 121. The path simulation circuit 121 may not only amplify and output a high-speed oscillation signal, but also simulate the circuit characteristics from the controller to an output end of the differential input circuit, so that the first oscillation signal and the second oscillation signal are more in line with the real application scenario of the memory, and thus the test accuracy of testing by utilizing the first oscillation signal and the second oscillation signal is further improved.

Meanwhile, the clock generation circuit provided by the embodiment also has the DCM function and the DCA function.

Correspondingly, the embodiments of the disclosure further provide a memory. The memory includes the clock generation circuit provided by the abovementioned embodiments. Specifically, the memory may be a Dynamic Random Access Memory (DRAM), a Static Random Access Memory (SRAM), a Magnetic Random Access Memory (MRAM), a Ferroelectric Random Access Memory (FeRAM), a Phase Change Random Access Memory (PCRAM), NAND, NOR and the like.

It can be seen from the above analysis that, the memory has a BIST function, so that a first oscillation signal and a second oscillation signal with high-speed for testing may be generated in the memory, and the duty cycles of the first oscillation signal and second oscillation signal may be maintained within the preset range, so that there is no need to use additional test equipment to provide test signals, and thus, the test accuracy of testing the memory is easily improved.

Figure 5:
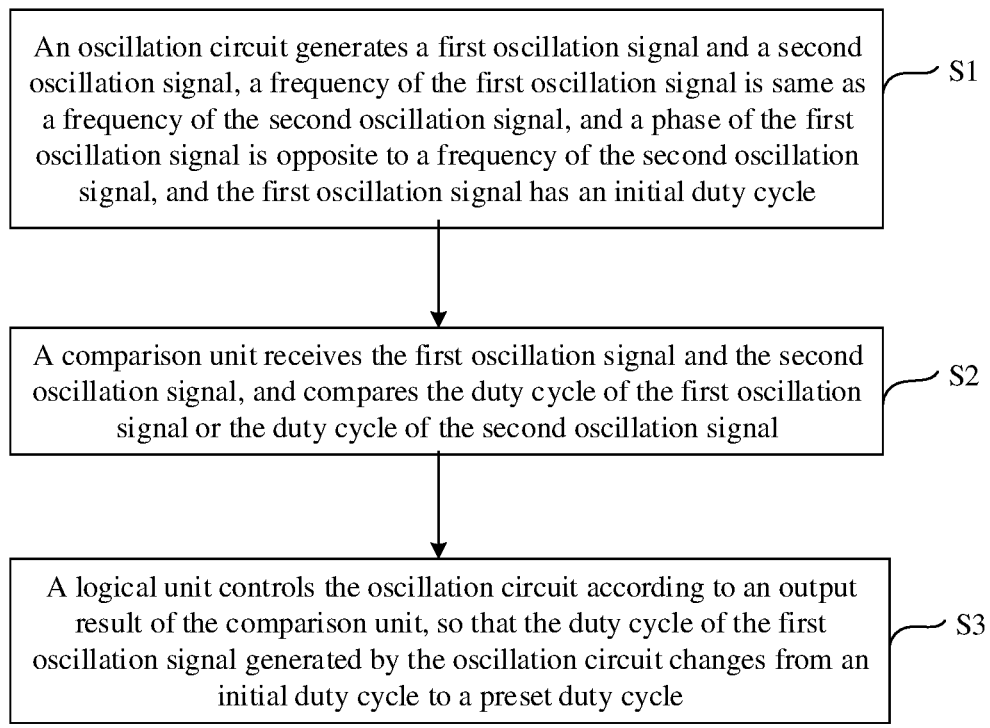
FIG. 5 is a schematic flowchart of a method for calibrating a clock duty cycle according to an embodiment of the disclosure.

Correspondingly, the embodiments of the disclosure further provide a method for calibrating a clock duty cycle. FIG. 5 is a schematic flowchart of a method for calibrating a clock duty cycle according to an embodiment of the disclosure. The method for calibrating the clock duty cycle in the embodiment of the disclosure will be described in detail in combination with the drawings. It should be understood that, the method for calibrating the clock duty cycle may be implemented by utilizing the clock generation circuit provided by the abovementioned embodiments.

Referring to FIG. 2 and FIG. 5, in the embodiment, the method for calibrating the clock duty cycle may include the steps S1 to S3.

At S1, an oscillation circuit generates a first oscillation signal and a second oscillation signal, the frequency of the first oscillation signal is the same as the frequency of the second oscillation signal, and the phase of the first oscillation signal is opposite to the phase of the second oscillation signal, and the first oscillation signal have an initial duty cycle.

Specifically, the initial duty cycle may be within the preset range. For example, the initial duty cycle is from 48% to 52%. The initial duty cycle may not reach the preset range, for example, the initial duty cycle is 45%. Moreover, the sum of the duty cycle of the first oscillation signal OSC+ and the duty cycle of the second oscillation signal OSC− is 100%.

At S2, a comparison unit receives the first oscillation signal and the second oscillation signal, and compares the duty cycle of the first oscillation signal or the duty cycle of the second oscillation signal.

Specifically, when the turnover identification signal is at a low level, the comparison unit compares the duty cycle of the first oscillation signal OSC+. For example, the comparison unit may determine whether the duty cycle of the first oscillation signal OSC+ is equal to a preset duty cycle or not. If it is less than the preset duty cycle, the comparison unit outputs a low level. If it is greater than or equal to the preset duty cycle, the comparison unit outputs a high level. When the turnover identification signal is at a high level, the comparison unit compares the duty cycle of the second oscillation signal OSC−. For example, the comparison unit may determine whether the duty cycle of the second oscillation signal OSC− is equal to the preset duty cycle or not. If it is less than the preset duty cycle, the comparison unit outputs a low level, and if it is greater than or equal to the preset duty cycle, the comparison unit outputs a high level. For example, the preset duty cycle may be 50%, the output of the comparison unit does not limit the corresponding relationship between the high level and the low level, and the duty cycle of the first oscillation signal OSC+ and the duty cycle of the second oscillation signal OSC−, as long as it is ensured that different output results correspond to the different corresponding relationships between the duty cycle of the first oscillation signal OSC+ and the duty cycle of the second oscillation signal OSC−.

An output result of the comparison unit may also represent a difference value between the duty cycle of the first oscillation signal OSC+ and the duty cycle of the second oscillation signal OSC−. For example, if an output result of the comparison unit is at a high level, it indicates that the duty cycle of the first oscillation signal OSC+ is greater than the duty cycle of the second oscillation signal OSC−; and if an output result of the comparison unit is at a low level, it indicates that the duty cycle of the first oscillation signal OSC+ is less than the duty cycle of the second oscillation signal OSC−. The sum of the duty cycle of the first oscillation signal OSC+ and the duty cycle of the second oscillation signal OSC− is 100%. For example, when the duty cycle of the first oscillation signal OSC+ changes from 49% to 51%, the output result of the comparison unit changes from a low level to a high level.

The comparison unit may include: an integral unit, having a first input end for receiving one of the first oscillation signal OSC+ or the second oscillation signal OSC−, and a second input end for receiving another one of the second oscillation signal OSC− or the first oscillation signal OSC+; and a comparator, connected to an output end of the integral unit.

When the turnover identification signal is at a low level, the first input end receives the first oscillation signal OSC+ and the second input end receives the second oscillation signal OSC−, and the comparator compares the duty cycle of the first oscillation signal OSC+ and has a corresponding output. The operation that the comparator compares the duty cycle of the first oscillation signal OSC+ may be that: the duty cycle of the first oscillation signal OSC+ and the duty cycle of the second oscillation signal OSC− are compared, or the duty cycle of the first oscillation signal OSC+ and the preset duty cycle are compared.

When the turnover identification signal is at a high level, the first input end receives the second oscillation signal OSC− and the second input end receives the first oscillation signal OSC+, and the comparator compares the duty cycle of the second oscillation signal OSC− and has a corresponding output. The operation that the comparator compares the duty cycle of the second oscillation signal OSC− may be that: the duty cycle of the second oscillation signal OSC− and the duty cycle of the first oscillation signal OSC+ are compared, or the duty cycle of the second oscillation signal OSC− and the preset duty cycle are compared.

At S3, a logical unit controls the oscillation circuit according to an output result of the comparison unit, so that the duty cycle of the first oscillation signal generated by the oscillation circuit changes from an initial duty cycle to a preset duty cycle.

Specifically, the logical unit may include a counter, a first register group and a second register group. The oscillation circuit is controlled by the counter, so that the duty cycle of the first oscillation signal OSC+ and the duty cycle of the second oscillation signal OSC− may be adjusted.

When the turnover identification signal is at a low level, the counter counts from M to N, when the value of the counter is M, the duty cycle of the first oscillation signal OSC+ is P %, when the value of the counter is N, the duty cycle of the first oscillation signal OSC+ is Q %, and when the output result of the comparison unit changes from low level to high level, the counter value corresponding to the counter at this time is stored in the first register group. For example, M may be 0, N may be 31, P may be 45, Q may be 55, and the initial duty cycle may be 45%, or other values.

When the turnover identification signal is at a high level, the counter counts from M to N, when the value of the counter is M, the duty cycle of the second oscillation signal OSC− is Q %, when the value of the counter is N, the duty cycle of the second oscillation signal OSC− is P %, and when the output result of the comparison unit changes from high level to low level, the counter value corresponding to the counter at this time is stored in the second register group. For example, M may be 0, N may be 31, P may be 45, Q may be 55, and the initial duty cycle may be 45%, or other values.

Both M and N are integers, M is less than N, both P and Q are positive integers, P is less than 50, and Q is greater than 50. The initial duty cycle may be any value from 1% to 99%, the preset duty cycle may be any value from 48% to 52%, or even the preset duty cycle may be equal to 50%.

More specifically, when the turnover identification signal is at a low level, the first input end receives the first oscillation signal OSC+ and the second input end receives the second oscillation signal OSC−, the counter counts from 0 to 31 within one counting cycle. When the output result of the comparison unit is at a low level, it indicates that the duty cycle of the first oscillation signal OSC+ is less than the duty cycle of the second oscillation signal OSC−; and when the output result of the comparison unit is at a high level, it indicates that the duty cycle of the first oscillation signal OSC+ is greater than the duty cycle of the second oscillation signal OSC−. Therefore, the output result of the comparison unit jumps from the low level to the high level, corresponding to an inversion point, and the counter value of the counter corresponding to the inversion point is used as the first value and stored in the first register group.

When the turnover identification signal is at a high level, the first input end receives the second oscillation signal OSC− and the second input end receives the first oscillation signal OSC+, the counter counts from 0 to 31 within one counting cycle. When the output result of the comparison unit is at a high level, it indicates that the duty cycle of the first oscillation signal OSC+ is less than the duty cycle of the second oscillation signal OSC−; and when the output result of the comparison unit is at a low level, it indicates that the duty cycle of the first internal signal IBO+ is greater than the duty cycle of the second oscillation signal OSC−. Therefore, the output result of the comparison unit jumps from the high level to the low level, corresponding to an inversion point, and the counter value of the counter corresponding to the inversion point is used as the second value and stored in the second register group.

It should be understood that, when the turnover identification signal is at a low level, the counter counts from 0 to 31, and the duty cycle of the first oscillation signal OSC+ changes monotonically, such as a preset step-by-step increase, for example, if the counter value of the counter increases by 1, the duty cycle of the first oscillation signal OSC+ increases by ((55−45)/32)%. In a similar way, when the turnover identification signal is at a high level, the counter counts from 0 to 31, and the duty cycle of the second oscillation signal changes monotonically, such as a preset step-by-step increase, for example, if the counter value of the counter increases by 1, the duty cycle of the second oscillation signal increases by ((55−45)/32)%.

The logical unit may further include an operation component and a third register group. The operation component performs at least one operation of addition, subtraction, multiplication or division on the outputs of the first register group and the second register group, and stores the obtained value L in the third register group. Herein, L is a positive integer, and L is greater than or equal to M and less than or equal to N.

In the embodiment, the value L is that the first value and the second value are added and then divided by 2. That is, the value L is the average of the first value and the second value, and the value L is the setting that the first oscillation signal OSC+ and the second oscillation signal OSC− output by the corresponding oscillation circuit reach the preset range. That is, the duty cycle of the first oscillation signal OSC+ corresponding to the value L is the preset duty cycle, and the preset duty cycle may be 48%-52%, such as 50%.

After the value L is obtained, the oscillation circuit is no longer controlled by the counter, but the value L is used as the setting of the oscillation circuit, so that the oscillation circuit outputs the first oscillation signal OSC+ with a preset duty cycle, and the corresponding second oscillation signal OSC− is also an oscillation signal whose duty cycle meets the requirements.

According to the technical solution of the method for calibrating the clock duty cycle provided by the embodiment, the first oscillation signal OSC+ and the second oscillation signal OSC− with high quality and high-speed may be obtained; and the duty cycle of the high-speed first oscillation signal OSC+ and the duty cycle of the second oscillation signal OSC− may be stabilized within the preset duty cycle.

It should be understood by those ordinary skilled in the art that, the above various implementations are specific embodiments for implementing the disclosure, in actual application, various changes on the embodiments can be made in form and detail, and the spirit and the scope of the disclosure are not deviated. Those skilled in the art may implement respective variations and modifications without departing from the spirit and scope of the disclosure, and thus the scope of protection of the disclosure should be subject to the scope defined by the claims.

INDUSTRIAL APPLICABILITY

In the embodiments of the disclosure, a clock generation circuit may include: an oscillation circuit, configured to generate a first oscillation signal and a second oscillation signal, the first oscillation signal and the second oscillation signal having the same frequency and opposite phases; a comparison unit, configured to receive the first oscillation signal and the second oscillation signal, and compare the duty cycle of the first oscillation signal and/or the duty cycle of the second oscillation signal; and a logical unit, connected to the comparison unit and the oscillation circuit, and configured to control the oscillation circuit according to an output result of the comparison unit, so that the duty cycles reach a preset range. In this way, the embodiment of the disclosure may generate a first oscillation signal and a second oscillation signal with stable duty cycles that may be used for memory testing. The first oscillation signal and the second oscillation signal may be used as input signals for testing the memory, and thus contribute to improving the test accuracy of the memory. Furthermore, the clock generation circuit also has a DCA function and a DCM function. Therefore, the memory with the clock generation circuit not only has a BIST function, but also can be used to implement the DCA function and the DCM function.

The invention claimed is:

1. A clock generation circuit, comprising:
an oscillation circuit, configured to generate a first oscillation signal and a second oscillation signal, wherein a frequency of the first oscillation signal is same as a frequency of the second oscillation signal, and a phase of the first oscillation signal is opposite to a phase of the second oscillation signal;
a comparison unit, configured to receive the first oscillation signal and the second oscillation signal, and compare at least one of: a duty cycle of the first oscillation signal or a duty cycle of the second oscillation signal; and
a logical unit, connected to the comparison unit and the oscillation circuit, and configured to control the oscillation circuit according to an output result of the comparison unit, so that the duty cycle of the first oscillation signal and the duty cycle of the second oscillation signal reach a preset range;
wherein the comparison unit comprises:
an integral unit, having a first input end for receiving one of the first oscillation signal or the second oscillation signal, and a second input end for receiving another one of the second oscillation signal or the first oscillation signal; and
a comparator, connected to an output end of the integral unit; and
wherein the integral unit is configured such that:
the first input end of the integral unit receives the first oscillation signal when a turnover identification signal is at a low level, and receives the second oscillation signal when the turnover identification signal is at a high level; and
the second input end of the integral unit receives the second oscillation signal when the turnover identification signal is at the low level, and receives the first oscillation signal when the turnover identification signal is at the high level.

2. The clock generation circuit of claim 1, wherein the logical unit comprises:
a counter, configured to adjust at least one of the duty cycle of the first oscillation signal or the duty cycle of the second oscillation signal;
a first register group, configured to store a first value of the counter according to an output of the comparator when the turnover identification signal is at the low level; and
a second register group, configured to store a second value of the counter according to the output of the comparator when the turnover identification signal is at the high level.

3. The clock generation circuit of claim 2, wherein the logical unit further comprises:
an operation component, connected to the first register group and the second register group, and configured to perform at least one operation of addition, subtraction, multiplication or division on outputs of the first register group and the second register group; and
a third register group, connected to the operation component, and configured to store an output result of the operation component.

4. The clock generation circuit of claim 3, wherein the comparison unit is driven by a sampling clock, and a frequency of the sampling clock is lower than at least one of the frequency of the first oscillation signal or the frequency of the second oscillation signal.

5. The clock generation circuit of claim 4, wherein the counter is driven by a calculator clock, and a frequency of the calculator clock is lower than at least one of the frequency of the first oscillation signal or the frequency of the second oscillation signal.

6. The clock generation circuit of claim 5, wherein the frequency of the sampling clock is same as the frequency of the calculator clock.

7. The clock generation circuit of claim 6, further comprising:
a frequency divider, configured to receive an external clock signal, and generate the sampling clock and the calculator clock.

8. The clock generation circuit of claim 7, further comprising:
a fifth register group, connected with the frequency divider, and configured to configure the frequency of the sampling clock and the frequency of the calculator clock.

9. The clock generation circuit of claim 1, wherein the oscillation circuit comprises:
an oscillator, configured to generate a first initial oscillation signal and a second initial oscillation signal, wherein a frequency of the first initial oscillation signal is same as a frequency of the second initial oscillation signal, and a phase of the first initial oscillation signal is opposite to a phase of the second initial oscillation signal; and
a path simulation circuit, located between the oscillator and the comparison unit, wherein one end of the path simulation circuit is connected to an output end of the oscillator, another end of the path simulation circuit is connected to an input end of the comparison unit, and the path simulation circuit is configured to simulate circuit characteristics of a first path, generate the first oscillation signal by receiving the first initial oscillation signal, and generate the second oscillation signal by receiving the second initial oscillation signal.

10. The clock generation circuit of claim 9, further comprising:
a fourth register group, connected with the oscillator, and configured to configure the frequency of the first oscillation signal and the frequency of the second oscillation signal.

11. The clock generation circuit of claim 10, further comprising:
a sixth register group, connected with the path simulation circuit, and configured to configure electrical parameters of the path simulation circuit.

12. A memory, comprising:
a clock generation circuit, the clock generation circuit comprising:
an oscillation circuit, configured to generate a first oscillation signal and a second oscillation signal, wherein a frequency of the first oscillation signal is same as a frequency of the second oscillation signal, and a phase of the first oscillation signal is opposite to a phase of the second oscillation signal;
a comparison unit, configured to receive the first oscillation signal and the second oscillation signal, and compare at least one of: a duty cycle of the first oscillation signal or a duty cycle of the second oscillation signal; and
a logical unit, connected to the comparison unit and the oscillation circuit, and configured to control the oscillation circuit according to an output result of the comparison unit, so that the duty cycle of the first oscillation signal and the duty cycle of the second oscillation signal reach a preset range;
wherein the comparison unit comprises:
an integral unit, having a first input end for receiving one of the first oscillation signal or the second oscillation signal, and a second input end for receiving another one of the second oscillation signal or the first oscillation signal; and
a comparator, connected to an output end of the integral unit; and
wherein the integral unit is configured such that:
the first input end of the integral unit receives the first oscillation signal when a turnover identification signal is at a low level, and receives the second oscillation signal when the turnover identification signal is at a high level; and
the second input end of the integral unit receives the second oscillation signal when the turnover identification signal is at the low level, and receives the first oscillation signal when the turnover identification signal is at the high level.

13. A method for calibrating a clock duty cycle, comprising:
generating, by an oscillation circuit, a first oscillation signal and a second oscillation signal, wherein a frequency of the first oscillation signal is same as a frequency of the second oscillation signal, and a phase of the first oscillation signal is opposite to a phase of the second oscillation signal, and the first oscillation signal having an initial duty cycle;
receiving, by a comparison unit, the first oscillation signal and the second oscillation signal, and comparing a duty cycle of the first oscillation signal or a duty cycle of the second oscillation signal; and
controlling, by a logical unit, the oscillation circuit according to an output result of the comparison unit, so that the duty cycle of the first oscillation signal generated by the oscillation circuit changes from the initial duty cycle to a preset duty cycle;
wherein receiving, by the comparison unit, the first oscillation signal and the second oscillation signal comprises:
receiving, by a first input end of an integral unit of the comparison unit, the first oscillation signal when a turnover identification signal is at a low level, and receiving, by the first input end of the integral unit of the comparison unit, the second oscillation signal when the turnover identification signal is at a high level; and
receiving, by a second input end of the integral unit of the comparison unit, the second oscillation signal when the turnover identification signal is at the low level, and receiving, by the second input end of the integral unit of the comparison unit, the first oscillation signal when the turnover identification signal is at the high level.

14. The method for calibrating the clock duty cycle of claim 13, wherein receiving, by the comparison unit, the first oscillation signal and the second oscillation signal comprises:
comparing, by the comparison unit, the duty cycle of the first oscillation signal when the turnover identification signal is at the low level; and
comparing, by the comparison unit, the duty cycle of the second oscillation signal when the turnover identification signal is at the high level.

15. The method for calibrating the clock duty cycle of claim 14, wherein the logical unit comprises a counter, a first register group and a second register group, and controlling, by the logical unit, the oscillation circuit according to the output result of the comparison unit comprises:
when the turnover identification signal is at the low level, counting, by the counter, from M to N, when a value of the counter is M, the duty cycle of the first oscillation signal is P %, when the value of the counter is N, the duty cycle of the first oscillation signal is Q %, and when the output result of the comparison unit changes from low level to high level, a counter value corresponding to the counter at this time is stored in the first register group; and when the turnover identification signal is at the high level, counting from M to N, when the value of the counter is M, the duty cycle of the second oscillation signal is Q %, when the value of the counter is N, the duty cycle of the second oscillation signal is P %, and when the output result of the comparison unit changes from the high level to the low level, the counter value corresponding to the counter at this time is stored in the second register group;

wherein both M and N are integers, M is less than N, both P and Q are positive integers, P is less than 50, and Q is greater than 50.

16. The method for calibrating the clock duty cycle of claim 15, wherein the logical unit further comprises an operation component and a third register group, and controlling, by the logical unit, the oscillation circuit according to the output result of the comparison unit, comprises:

performing, by the operation component, at least one operation of addition, subtraction, multiplication or division on outputs of the first register group and the second register group, and storing an obtained value L in the third register group;

wherein the L is a positive integer, and L is greater than or equal to M and less than or equal to N.

17. The method for calibrating the clock duty cycle of claim 16, wherein the duty cycle of the first oscillation signal corresponding to the L is the preset duty cycle.

\* \* \* \* \*